(12) United States Patent
Lim

(10) Patent No.: US 7,652,224 B2
(45) Date of Patent: Jan. 26, 2010

(54) SEMICONDUCTOR WAFER MARKING APPARATUS HAVING MARKING INTERLOCK SYSTEM AND SEMICONDUCTOR WAFER MARKING METHOD USING THE SAME

(75) Inventor: Ki-youl Lim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 493 days.

(21) Appl. No.: 11/448,305

(22) Filed: Jun. 7, 2006

(65) Prior Publication Data
US 2006/0276000 A1 Dec. 7, 2006

(30) Foreign Application Priority Data
Jun. 7, 2005 (KR) ............... 10-2005-0048418

(51) Int. Cl.
*B23K 26/00* (2006.01)
(52) U.S. Cl. .................................. 219/121.68
(58) Field of Classification Search ............ 372/35; 219/121.62, 121.68, 121.84, 121.69; 700/166
See application file for complete search history.

(56) References Cited

U.S. PATENT DOCUMENTS

| | | | | |
|---|---|---|---|---|
| 4,555,610 A * | 11/1985 | Polad et al. | ............ | 219/121.62 |
| 4,852,109 A * | 7/1989 | Kuchar | .............. | 372/35 |
| 5,065,330 A * | 11/1991 | Karube et al. | ............. | 700/166 |
| 6,201,210 B1 * | 3/2001 | Sans I Ravellat et al. | .......... | 219/121.68 |
| 6,487,460 B1 * | 11/2002 | Haeno | ............... | 700/166 |
| 6,765,941 B2 * | 7/2004 | Nolan | ............... | 372/35 |
| 6,792,017 B2 * | 9/2004 | Halpin | ............... | 372/35 |
| 7,346,086 B2 * | 3/2008 | Ryan et al. | ............ | 372/29.02 |
| 2004/0151217 A1 * | 8/2004 | Yeik | .............. | 372/35 |
| 2004/0202211 A1 * | 10/2004 | Paetzel | ............ | 372/35 |
| 2005/0201430 A1 * | 9/2005 | Koshimae et al. | ........ | 372/29.02 |

FOREIGN PATENT DOCUMENTS

| | | | |
|---|---|---|---|
| EP | 1057578 A2 * | 12/2000 | |
| JP | 61-71684 A * | 4/1986 | |
| JP | 4-51655 A * | 6/1990 | |

(Continued)

OTHER PUBLICATIONS

Computer Translation of Japan Patent document No. 2001-7433, Apr. 7, 2009.*

(Continued)

*Primary Examiner*—Geoffrey S Evans
(74) *Attorney, Agent, or Firm*—Mills & Onello, LLP.

(57) ABSTRACT

A semiconductor wafer marking apparatus and a semiconductor wafer marking method includes a laser head unit including a flowcell having a laser radiation region and a laser source radiating laser energy on the laser radiation region in response to an input current. An optical system radiates a laser beam on the semiconductor wafer. A cooling water reservoir stores cooling water. A pipe is disposed in the flowcell and connected to the cooling water reservoir. A marking interlock system detects leakage of cooling water from the pipe, an abnormal temperature of the laser radiation region, and an abnormal input current supplied to the laser source, and generates a marking interlock signal to terminate a marking operation of the semiconductor wafer. A marking unit turns off the laser source to terminate the marking of the semiconductor wafer in response to the marking interlock signal.

22 Claims, 10 Drawing Sheets

FOREIGN PATENT DOCUMENTS

| | | | |
|---|---|---|---|
| JP | 2001-7433 A | * | 1/2001 |
| JP | 2003-152250 A | * | 5/2003 |
| KR | 10-0211651 | | 8/1999 |
| KR | 1020010080864 A | | 8/2001 |
| KR | 10-2002-0078579 | | 10/2002 |
| KR | 10-2005-0008530 | | 1/2005 |

OTHER PUBLICATIONS

Notice to Submit Response and English-language translation issued Jul. 28, 2006 in counterpart Korean application No. 10-2005-0048418.

* cited by examiner

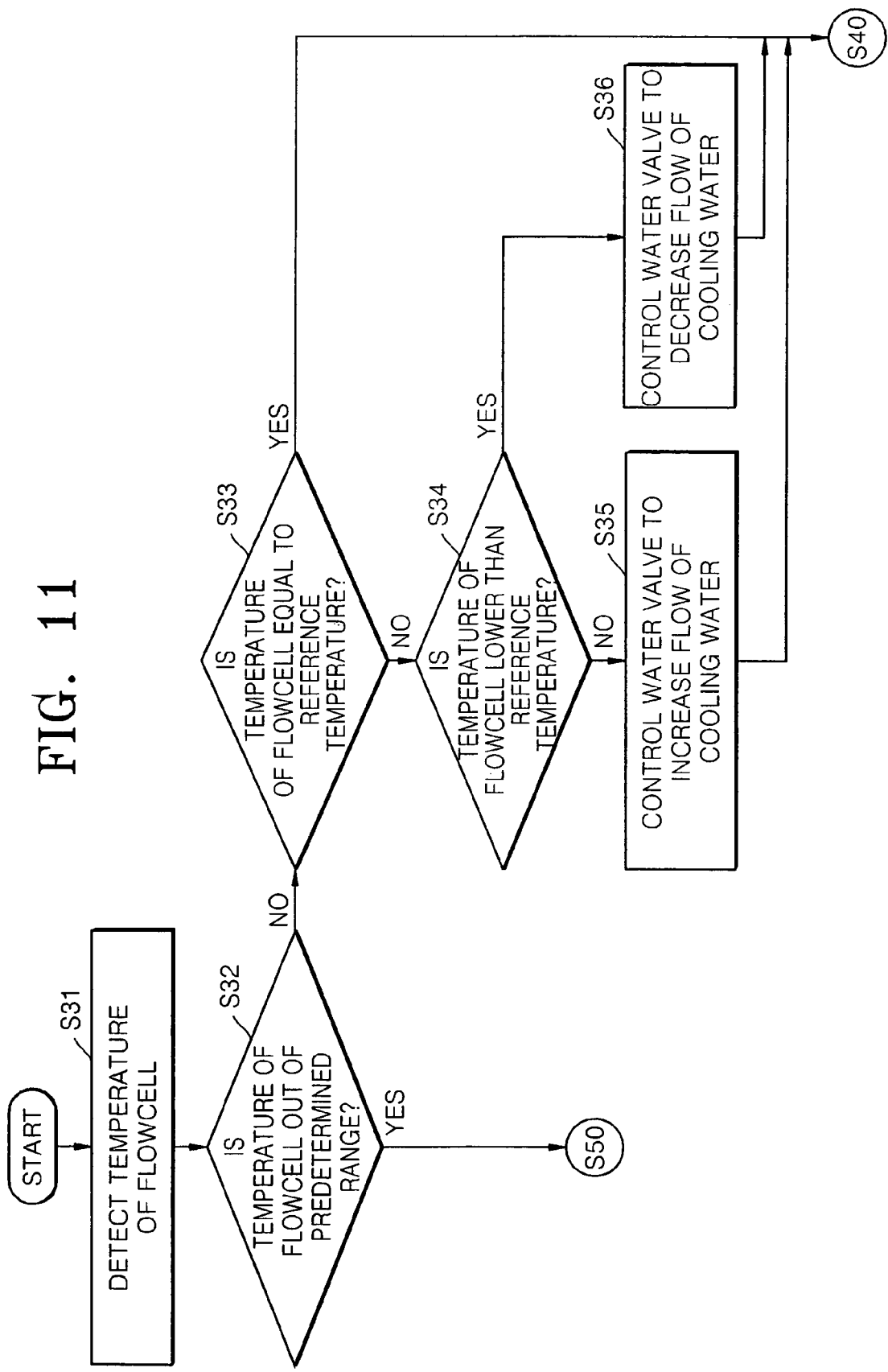

SEMICONDUCTOR WAFER MARKING APPARATUS HAVING MARKING INTERLOCK SYSTEM AND SEMICONDUCTOR WAFER MARKING METHOD USING THE SAME

CROSS-REFERENCE TO RELATED PATENT APPLICATION

This application claims priority to Korean Patent Application No. 10-2005-0048418, filed on Jun. 7, 2005, in the Korean Intellectual Property Office, the disclosure of which is incorporated herein in its entirety by reference.

BACKGROUND OF THE INVENTION

1. Field of the Invention

The present invention relates to a semiconductor wafer marking system, and more particularly, to a semiconductor wafer marking apparatus having a marking interlock system and a semiconductor wafer marking method using the same.

2. Description of the Related Art

In general, photography, ion diffusion, etching, and deposition are repeatedly performed on a wafer when manufacturing a semiconductor device. A test process is then performed on the wafer following manufacturing of the semiconductor device to determine whether the wafer has defects. When the test process is completed, the wafer is cut in a scribing process, and is packaged to form chips.

An identification mark is provided on a portion of the wafer to identify the wafer in the semiconductor manufacturing process. The identification mark is provided to manage various and strict process conditions for respective semiconductor manufacturing processes, or to indicate a product name, management code, manufacturing date, etc. The identification mark is marked using numerals, characters, or symbols composed of dots on a portion of the surface of a wafer.

Marking methods for forming an identification mark on a semiconductor wafer can generally be classified as ink marking methods and laser marking methods. The laser marking method is preferred because of its convenience and easy maintenance. In a typical laser marking method, a continuous pulse-type laser is radiated on a portion of the surface of a semiconductor wafer using an optical system such that dot shape characters or numerals are marked on the semiconductor wafer. As semiconductor devices continue to become more highly integrated, several hundred process steps may be required to manufacture a semiconductor device. Accordingly, to obtain the history of the manufacturing processes, instead of a simple identification mark, mark history data of the manufacturing processes is made on a wafer. In general, a laser, for example, a He—Ne laser, is radiated on a wafer on which an identification mark is marked and then the identification mark is read using changes in a reflection ratio or thermo-wave vibration of the laser reflected from the wafer. The process conditions for manufacturing a semiconductor device are defined according to the data read.

Referring to FIG. 1, a conventional laser marking apparatus radiates a laser beam generated from a laser head unit (not illustrated) onto a wafer 10 through an optical system to form an identification mark 20 on a predetermined region of the wafer 10. The identification mark 20 includes characters or numerals composed of dots. In a wafer marking method using the conventional laser marking apparatus, when laser energy generated by a laser diode is too weak, dots are not sufficiently formed on the wafer 10. If processes of manufacturing semiconductor device are performed, a portion of the identification mark, e.g., the portion enclosed within the solid circle of FIG. 2A, is concealed by chemicals during the manufacturing processes such that the identification mark 20 becomes useless.

If the laser energy is too strong, particles 22 are generated as illustrated in FIG. 2B. The particles 22 are adsorbed onto device forming regions 11 of the wafer 10 which can cause defects in the semiconductor devices of the device forming regions 11. In addition, the particles adsorbed onto the device forming regions 11 can scratch the surface of the wafer during subsequent processes, for example, during a chemical mechanical polishing (CMP) process. Such a marking defect cannot be detected during the marking process, but only after the subsequent manufacturing processes have been completed. For this reason, the conventional method is disadvantageous in terms of costs and time.

FIG. 3 is a perspective view of a laser head unit of a conventional semiconductor wafer marking apparatus 30. Referring to FIG. 3, the conventional semiconductor wafer marking apparatus 30 includes a laser source 60 and a flowcell 40. The laser source 60 includes laser diodes and generates a laser to form the identification mark 20 on the wafer 10. The flowcell 40 disperses the laser radiated from the laser source 60. The flowcell 40 is fixed on a table 50, and the laser source 60 is disposed above a laser radiation region 41 of the flowcell 40.

A pipe 90 through which cooling water flows is disposed inside of the flowcell 40 and is connected to a cooling water reservoir 70 where the cooling water is stored. Accordingly, the temperature of the laser radiation region 41 of the flowcell 40 can be maintained at a constant level due to the presence of the cooling water supplied from the cooling water reservoir 70. When the cooling water flowing through the pipe 90 maintains the flowcell 40 at a constant temperature, the flowcell 40 disperses the laser energy which is emitted by the laser source 60. The laser dispersed by the flowcell 40 is transmitted through an optical system (not illustrated) on the wafer 10 as illustrated in FIG. 1, and forms the dot type identification mark 20.

In the conventional semiconductor wafer marking apparatus 30, the energy of the laser beam radiated onto the wafer 10 should be constant so as to precisely mark the identification mark 20 on the wafer 10. If the energy of the laser beam radiated onto the wafer 10 varies, dot defects or particles are generated, as described above. A common cause of the change in the energy of the laser beam radiated onto the wafer 10 is the temperature of the laser radiation region 41 of the flowcell 40. The temperature of the laser radiation region 41 is dependent on the temperature of the cooling water stored in the cooling water reservoir 70 and circulated in the flowcell 40 through the pipe 90. Because the cooling water circulated in the flowcell 40 maintains the laser radiation region 41 at a constant temperature, when the temperature of the cooling water is changed, the temperature of the laser radiation region 41 of the flowcell 40 is also changed. Due to such a temperature change, the dispersion of the laser radiated onto the laser radiation region 41 is changed, thereby changing the energy of the laser beam radiated onto the wafer 10 through the optical system.

In the conventional marking apparatus, a temperature sensor 71 is attached to the cooling water reservoir 70 and controlled by a controller 80 to maintain the cooling water stored in the cooling water reservoir 70 at a constant temperature. However, only the temperature of the cooling water in the cooling water reservoir 70 is maintained at a constant level, and not the temperature of the cooling water circulating in the flowcell 40 through the pipe 90. Accordingly, even through the temperature of the cooling water in the cooling water reservoir 70 is maintained at a constant level, the temperature of the cooling water circulated through the pipe 90 in the flowcell 40 can be changed such that the temperature of the laser radiation region 41 of the flowcell 40 is changed, resulting in variation in the energy of the laser beam used for the wafer marking.

Another potential cause of change in the energy of the laser beam is cooling water leakage in the pipe 90. The cooling water leakage in the pipe 90 changes the temperature of the cooling water and the energy of the laser beam. Another potential cause of change in the energy of the laser is the input current signal that is input to the laser diode of the laser source 60. That is, the input current changes the energy of the laser generated by the laser diode, thereby changing the energy beam radiated onto the wafer 10.

In the conventional marking apparatus, there is no unit which can detect the cooling water leakage in the pipe 90 in the flowcell 40 or the level of the input current supplied to the laser diode of the laser source 60. Therefore, a marking operation is performed even when a cooling water leakage occurs or when a change in the input current supplied to the laser diode is generated during the wafer marking operation. Consequently, the above-described marking defects cannot be prevented.

SUMMARY OF THE INVENTION

The present invention provides a semiconductor wafer marking apparatus that maintains the energy of a laser beam radiated onto a wafer to form a uniform identification mark on the wafer, and that has a marking interlock system that terminates a malfunctioning marking operation.

The present invention also provides a semiconductor wafer marking method that can form a uniform identification mark using the semiconductor wafer marking apparatus.

According to an aspect of the present invention, there is provided a semiconductor wafer marking apparatus including a laser head unit including a flowcell having a laser radiation region on an upper surface thereof and a laser source radiating laser energy on the laser radiation region in response to an input current. An optical system focuses the laser energy radiated from the laser source to form a laser beam and radiates the laser beam on the semiconductor wafer. A cooling water reservoir stores cooling water. A pipe is disposed in the flowcell and connected to an inlet and an outlet of the cooling water reservoir. The cooling water flows through the pipe to maintain the laser radiation region of the flowcell at a constant temperature. A marking interlock system detects leakage of cooling water from the pipe, an abnormal temperature of the laser radiation region, and an abnormal input current supplied to the laser source, and generates a marking interlock signal to terminate a marking operation of the semiconductor wafer. A marking unit turns off the laser source to terminate the marking of the semiconductor wafer in response to the marking interlock signal generated by the marking interlock system.

In one embodiment, the laser source comprises a plurality of laser diodes disposed above the laser radiation region of the flowcell.

In another embodiment, the marking interlock system may include a leakage detecting sensor, a temperature detecting sensor, and a current detecting sensor and controller. The leakage detecting sensor may detect the leakage of the cooling water flowing through the pipe, and may be disposed on a portion of the lower surface of the flowcell below the pipe. The temperature detecting sensor may detect the temperature of the laser radiation region on the flowcell, and may be disposed on the upper surface of the flowcell, adjacent to the laser radiation region. The current detecting sensor may detect an input current supplied to the laser source, and may be connected to an input node of the laser source. A controller may receive output signals transmitted from the leakage detecting sensor, the temperature detecting sensor, and the current detecting sensor, and output a control signal to control the marking unit.

In another embodiment, the semiconductor wafer marking apparatus may further include a water valve which is connected to the pipe, and controlled by the marking interlock system, and controls the flow of the cooling water. The water valve may be disposed adjacent to the outlet of the cooling water reservoir, through which the cooling water flows toward the flowcell.

According to another aspect of the present invention, there is provided a marking interlock system of the semiconductor wafer marking apparatus including: a leakage control unit which detects leakage of the cooling water; a temperature control unit which detects a temperature of a laser radiation region of the flowcell; a current control unit which detects an input current supplied to the laser source; a controller which receives at least one of a leakage detecting signal transmitted from the leakage control unit, an abnormal temperature detecting signal transmitted from the temperature control unit, and an abnormal input current signal transmitted from the current control unit, and generates in response an alarm control signal and a marking interlock signal; an alarm unit which indicates at least one of the leakage detected by the leakage control unit, the abnormal temperature detected by the temperature control unit, and the abnormal input current detected by the current control unit in response to the alarm control signal transmitted from the controller; and a marking interlock control unit which turns off the laser source in response to the marking interlock signal transmitted from the controller.

In one embodiment, the leakage control unit may include: a leakage detecting sensor which detects the leakage of the cooling water; a reference resistance generating unit which generates a reference signal; and a leakage detecting unit which compares an output signal transmitted from the leakage detecting sensor and the reference signal transmitted from the reference resistance generating unit and generates a leakage detecting signal. The temperature control unit may include: a temperature detecting sensor which detects the temperature of the laser radiation region of the flowcell; and a temperature calculating unit which digitizes an output signal transmitted from the temperature detecting sensor. The temperature control unit may further includes a feedback unit which maintains the cooling water stored in the cooling water reservoir at a constant temperature using a feedback control signal transmitted form the controller receiving an output signal transmitted from the temperature calculating unit.

In another embodiment, the current control unit may include: a current detecting sensor which detects the input current supplied to the laser source; a current calculating unit which digitizes the input current detected by the current detecting sensor; and a data log unit which logs an output signal of the current calculating unit through the controller. The marking interlock system may further include: a water valve which is connected to the pipe and controls the flow of the cooling water; and a water valve control unit which controls the water valve in response to a water valve control signal transmitted form the controller.

In another embodiment, the alarm unit may include an alarm generating unit, a warning display unit and an alarm control unit. The alarm generating unit may generate an alarm when at least one of the leakage is detected by the leakage control unit, the abnormal temperature is detected by the temperature control unit, and the abnormal input current is detected by the current control unit. The warning display unit may display a warning when at least one of the leakage is detected by the leakage control unit, the abnormal temperature is detected by the temperature control unit, and the abnormal input current is detected by the current control unit. The alarm control unit may control the alarm generating unit and the warning display unit in response to the alarm control signal transmitted from the controller.

According to still another aspect of the present invention, there is provided a semiconductor wafer marking method including: performing a marking operation on the semiconductor wafer; detecting leakage of the cooling water in the flowcell from the pipe; detecting the temperature of a portion of the flowcell on which the laser energy is radiated; detecting an input current supplied to the laser source; and interlocking the marking of the semiconductor wafer when at least one of the leakage is detected, an abnormal temperature is detected and an abnormal input current is detected.

In one embodiment, the detecting of the leakage may include: sensing the leakage of the cooling water in the flowcell from the pipe to generate a sensing signal; determining the leakage of the cooling water by comparing the sensor signal with a reference signal; performing the interlocking of the marking when the leakage of the cooling water is detected and stopping the marking of the semiconductor wafer; and performing the detecting of the temperature when leakage of the cooling water is not detected.

In another embodiment, the detecting of the temperature may include: detecting the temperature of the flowcell; determining whether the detected temperature of the flowcell is outside of a predetermined range of temperatures; performing the interlocking of the marking when the detected temperature of the flowcell is outside of the predetermined temperature range and stopping the marking on the semiconductor wafer; determining whether the detected temperature is equal to a predetermined reference temperature when the detected temperature of the flowcell is within the predetermined temperature range; performing the detecting of the current when the detected temperature is equal to the predetermined reference temperature; determining whether the detected temperature is lower than the predetermined reference temperature when the detected temperature is not equal to the predetermined reference temperature; increasing the flow of the cooling water which is supplied from the cooling water reservoir and circulated in the flowcell when the detected temperature is lower than the predetermined reference temperature; and decreasing the flow of the cooling water which is supplied from the cooling water reservoir and circulated in the flowcell when the detected temperature is higher than the predetermined reference temperature.

In another embodiment, the method may include after the detecting of the input current: logging and storing the detected input current; determining whether the detected input current is within a predetermined current range; performing the marking when the detected input current is within the predetermined current range; and performing the interlocking of the marking when the detected input current is outside of the predetermined current range and stopping the marking of the semiconductor wafer.

In another embodiment, the detecting of the leakage, the detecting of the temperature, and the detecting of the current may be sequentially or simultaneously performed.

In another embodiment, the interlocking of the marking may include: blocking the cooling water from circulating through the pipe when at least one of the leakage is detected in the detecting of the leakage, the detected temperature is determined to be outside of the predetermined temperature range in the detecting of the temperature, and the detected current is determined to be outside of the predetermined current range in the detecting of the current; stopping the marking of the semiconductor wafer; and indicating the stopping of the marking on the semiconductor wafer.

In another embodiment, performing the marking operation comprises: marking the semiconductor wafer using the laser energy generated by the laser source; determining whether the marking of the semiconductor wafer is completed after the detecting of the leakage, temperature, and input current; continuing the marking operation of the semiconductor wafer when the marking is not finished; and terminating the marking operation when the marking is finished.

BRIEF DESCRIPTION OF THE DRAWINGS

The above and other features and advantages of the present invention will become more apparent by describing in detail exemplary embodiments thereof with reference to the attached drawings in which:

FIG. 11 is a flowchart illustrating a process of detecting temperature in the semiconductor wafer marking method of FIG. 10, according to an embodiment of the present invention.

DETAILED DESCRIPTION OF EMBODIMENTS OF THE INVENTION

Figure 1:
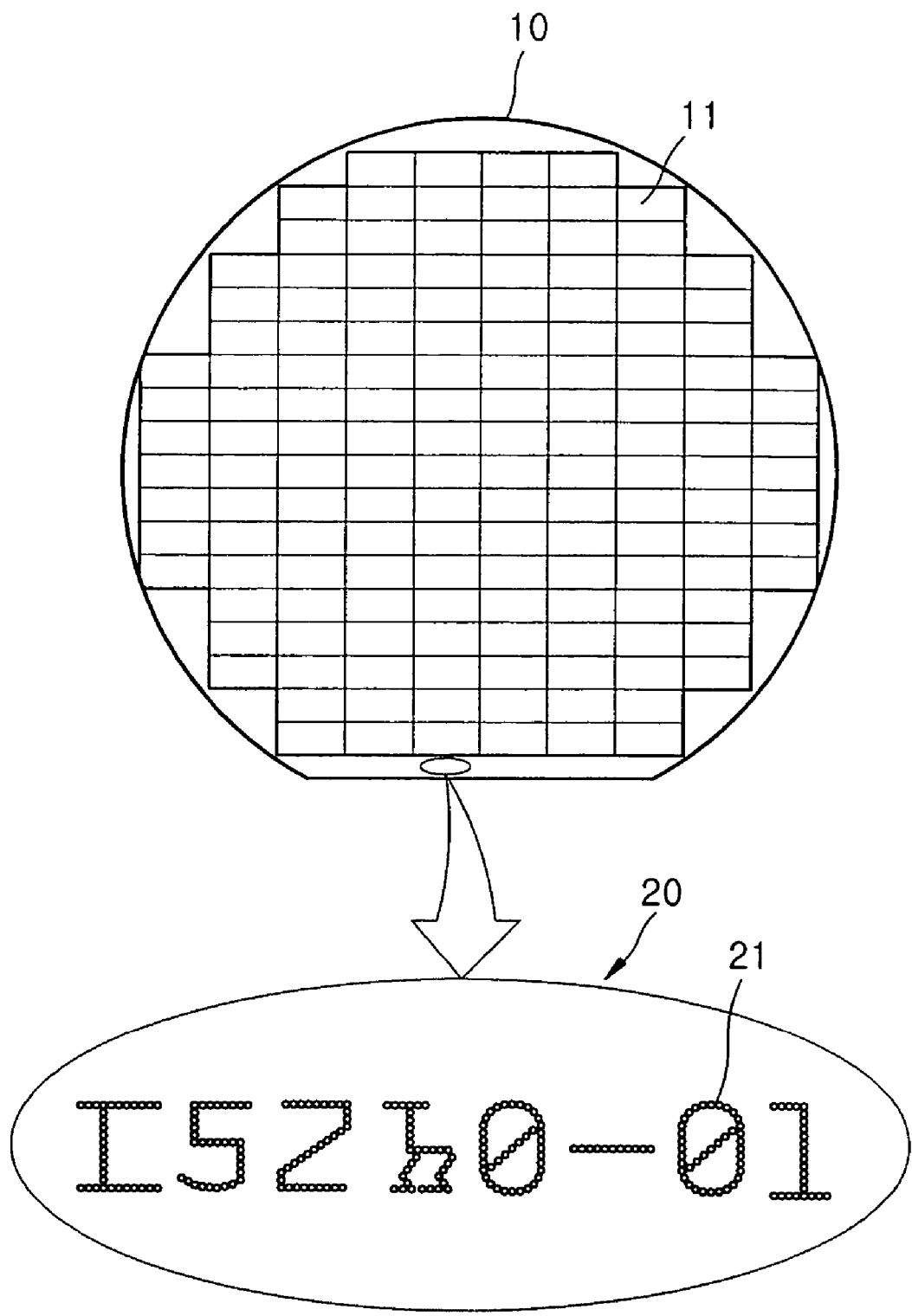
FIG. 1 is a plan view of a semiconductor wafer having a conventional identification mark.
Figure 2A:
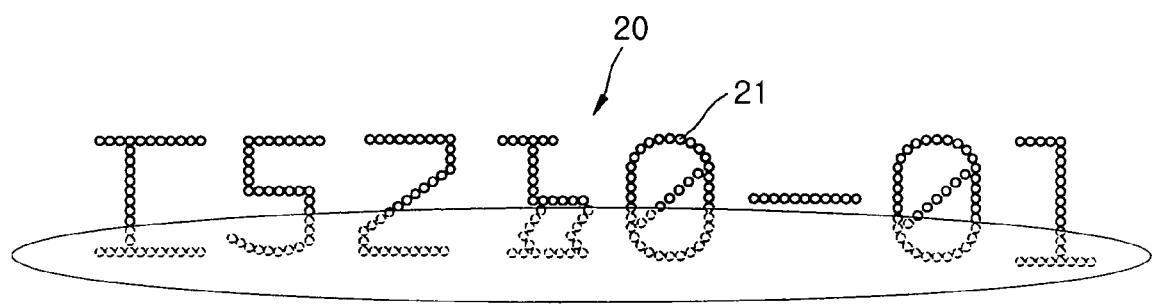
FIG. 2A illustrates marking defects that occur when a semiconductor wafer is marked using a conventional semiconductor wafer marking apparatus.
Figure 2B:
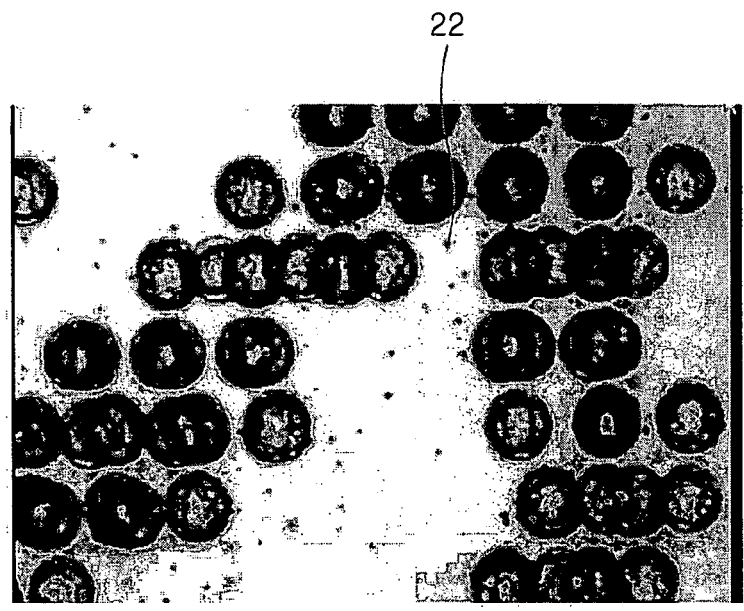
FIG. 2B illustrates particles generated when a semiconductor wafer is marked using a conventional semiconductor wafer marking apparatus.
Figure 3:
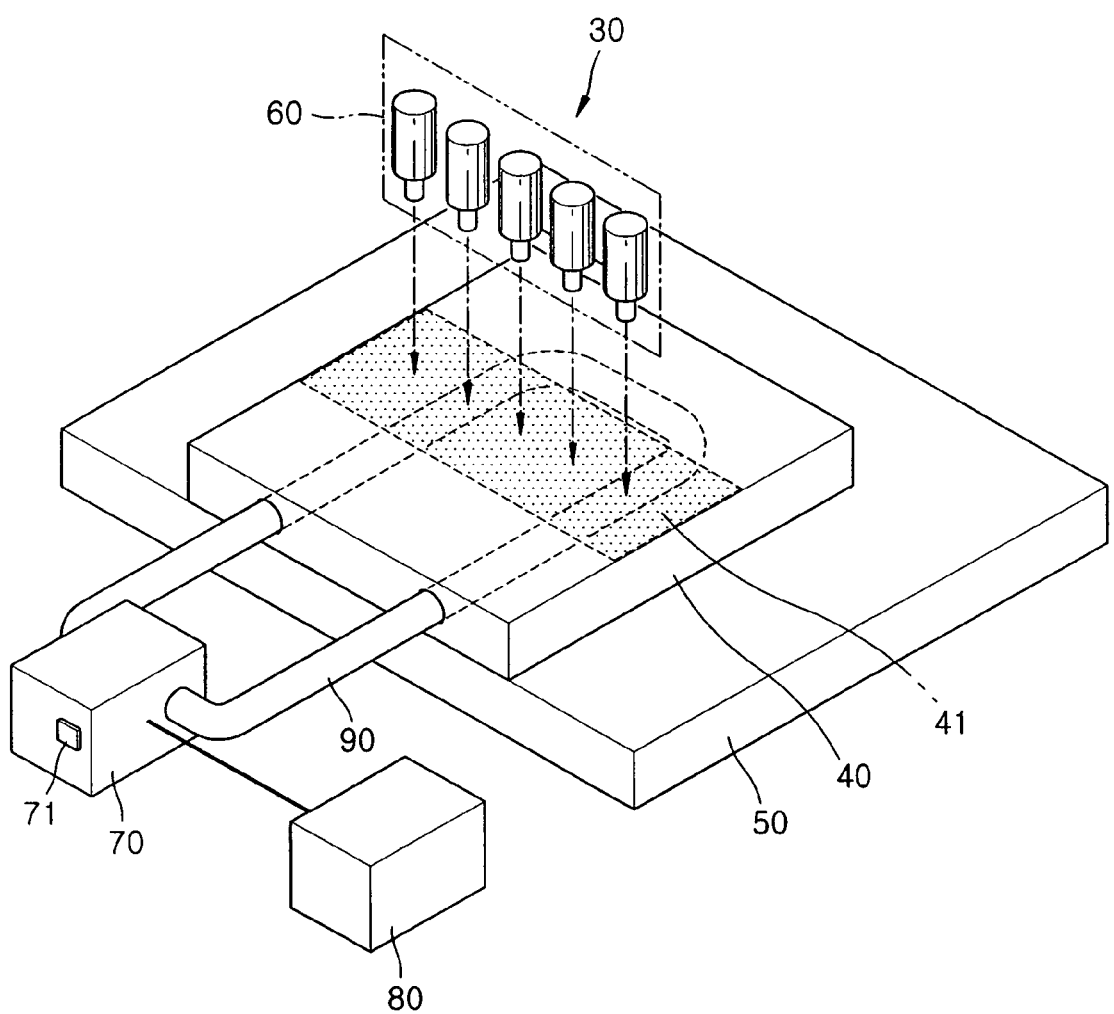
FIG. 3 is a perspective view of a conventional semiconductor wafer marking apparatus.

Hereinafter, the present invention will be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete. In the drawings, like reference numerals denote like elements, and the sizes and thicknesses of layers and regions are exaggerated for clarity.

Figure 4:
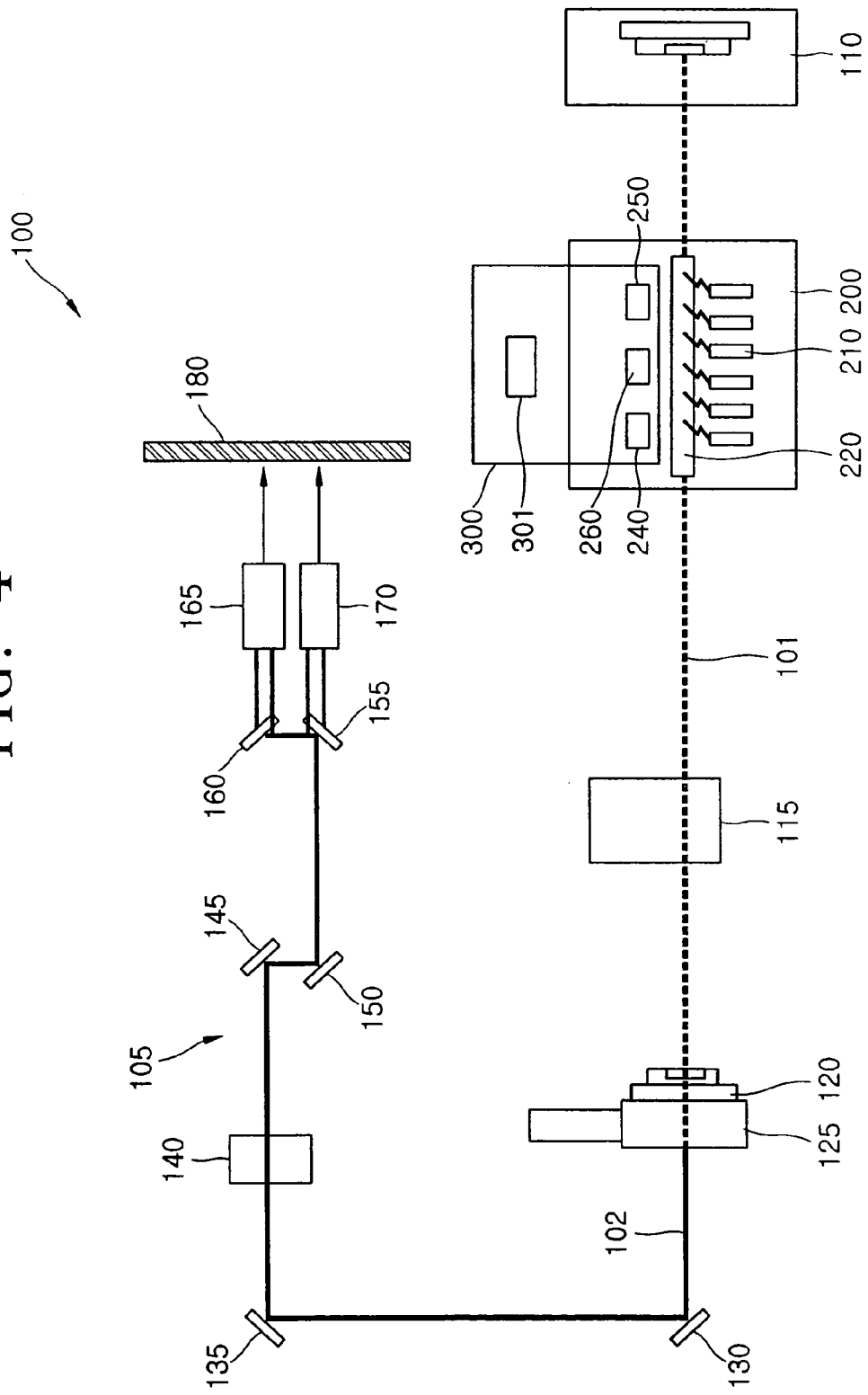
FIG. 4 is a schematic diagram of a semiconductor wafer marking apparatus according to an embodiment of the present invention.
Figure 5:
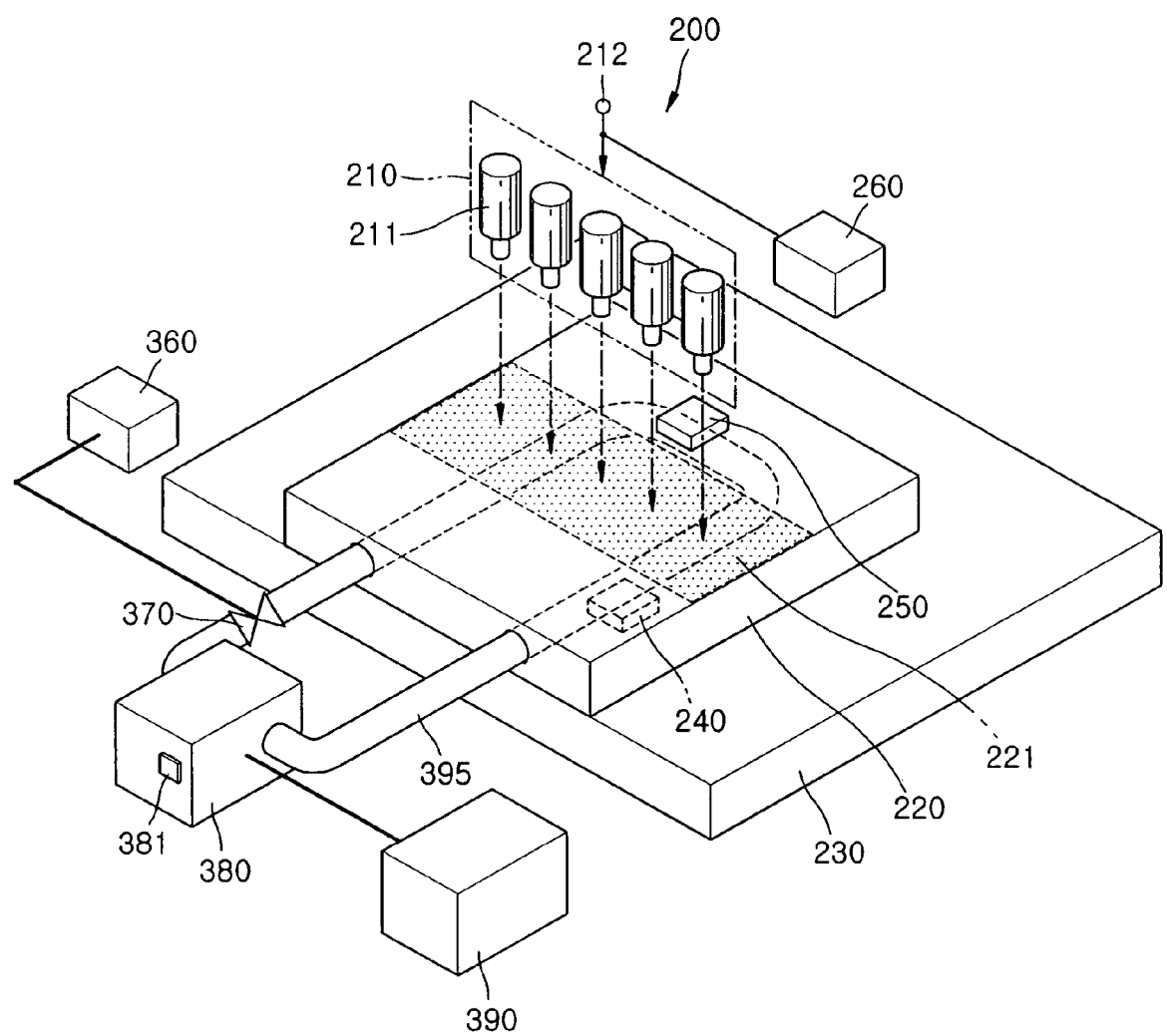
FIG. 5 is a perspective view of a laser head unit and a marking interlock system of the semiconductor wafer marking apparatus of FIG. 4, according to an embodiment of the present invention.

FIG. 4 is a schematic diagram of a semiconductor wafer marking apparatus 100 according to an embodiment of the present invention. FIG. 5 is a perspective view of a laser head unit 200 and a marking interlock system 300 of the semiconductor wafer marking apparatus 100 of FIG. 4, according to an embodiment of the present invention. Referring to FIGS. 4 and 5, the semiconductor wafer marking apparatus 100 includes the laser head unit 200, the marking interlock system 300, and an optical system 105. The laser head unit 200 includes a laser source 210 and a flowcell 220. The laser source 210 includes a plurality of laser diodes 211. The laser diodes 211 are disposed above the upper surface of the flowcell 220, for example, over a laser radiation region 221 of the flowcell 220. In FIG. 4, the laser diodes 211 appear to contact the upper surface of the flowcell 220, but the laser diodes 211 are rather suspended above the laser radiation region 221 of the flowcell 220.

The flowcell 220 dissipates a laser generated by the laser source 210. The flowcell 220 is fixed by a fixing unit such as bolts and nuts (not illustrated) on a table 230. A pipe 395 through which cooling water is circulated to maintain the laser radiation region 221 at a constant temperature is disposed inside of the flowcell 220. The pipe 395 passes through the laser radiation region 221. The shape of the pipe 395 can be varied, for example, the pipe can be arranged in zigzag configuration, to provide cooling fluid and thereby maintain the laser radiation region 221 at a constant temperature.

The pipe 395 is connected to the inlet and outlet of a cooling water reservoir 380, and the cooling water is stored in the cooling water reservoir 380 and is circulated through the pipe 395 to maintain the laser radiation region 221 of the flowcell 220 at a constant temperature. In addition, a water valve 370 is connected to the pipe 395 to control the flow of the cooling water. The water valve 370 may be disposed adjacent to the outlet of the cooling water reservoir 380 so as to block the cooling water flowing from the cooling water reservoir 380 to the laser radiation region 221 of the flowcell 220. Accordingly, the water valve 370 can control the flow of the cooling water flowing from the cooling water reservoir 380 to the laser radiation region 221 of the flowcell 220 in response to a water valve control unit 360 of the marking interlock system 300. A temperature sensor 381 is installed in the cooling water reservoir 380, and the controller 390 controls the cooling water reservoir 380 to maintain the cooling water stored in the cooling water reservoir 380 at a constant temperature.

The marking interlock system 300 includes a leakage detecting sensor 240, a temperature detecting sensor 250, a current detecting sensor 260, and a main controller 301. The leakage detecting sensor 240 detects any leakage of the cooling water flowing in the flowcell 220 through the pipe 395 and is installed in the lower portion of the flowcell 220. The leakage detecting sensor 240 may be disposed between the flowcell 220 and the table 230 below the pipe 395 so as to easily detect the leakage of the cooling water flowing in the flowcell 220. The temperature detecting sensor 250 detects the temperature of the laser radiation region 221 of the flowcell 220, and is disposed on the upper surface of the flowcell 220.

The temperature detecting sensor 250 may be disposed on the upper surface of the flowcell 220 adjacent to the laser radiation region 221 so as to readily detect the temperature of the laser radiation region 221 of the flowcell 220. The current detecting sensor 260 detects an input current supplied to the laser diodes 211 of the laser source 210 and is connected to input nodes 212 of the laser diodes 211. The main controller 301 receives the output signals from the leakage detecting sensor 240, the temperature detecting sensor 250, and the current detecting sensor 260, turns off the laser source 210 when abnormal properties are detected, and thus performs a marking interlock operation.

The optical system 105 includes a plurality of mirrors 110, 120, 130, 135, 145, 150, 155, and 160, a switch 115, a beam shutter 125, a lens system 140, x-axis and y-axis galvanometers 165 and 170. The mirror 110 is a rear mirror and the mirror 120 is a front mirror, and they supply a laser beam 101 dispersed through the flowcell 200 to the beam shutter 125. The switch 115 blocks a laser beam 102 to provide a pulse because an identification mark marked on the wafer 180 is formed of dots. The beam shutter 125 receives the laser beam 101 to generate the laser beam 102 with a circular cross section. The mirrors 130, 135, 145, 150, 155, and 160 reflect the laser beam 102. The lens system 140 converges the laser beam 102 reflected from the lens 135. The x-axis galvanometer 165 and the y-axis galvanometer 170 align the laser beam to a marking position on the wafer 180.

Figure 6:
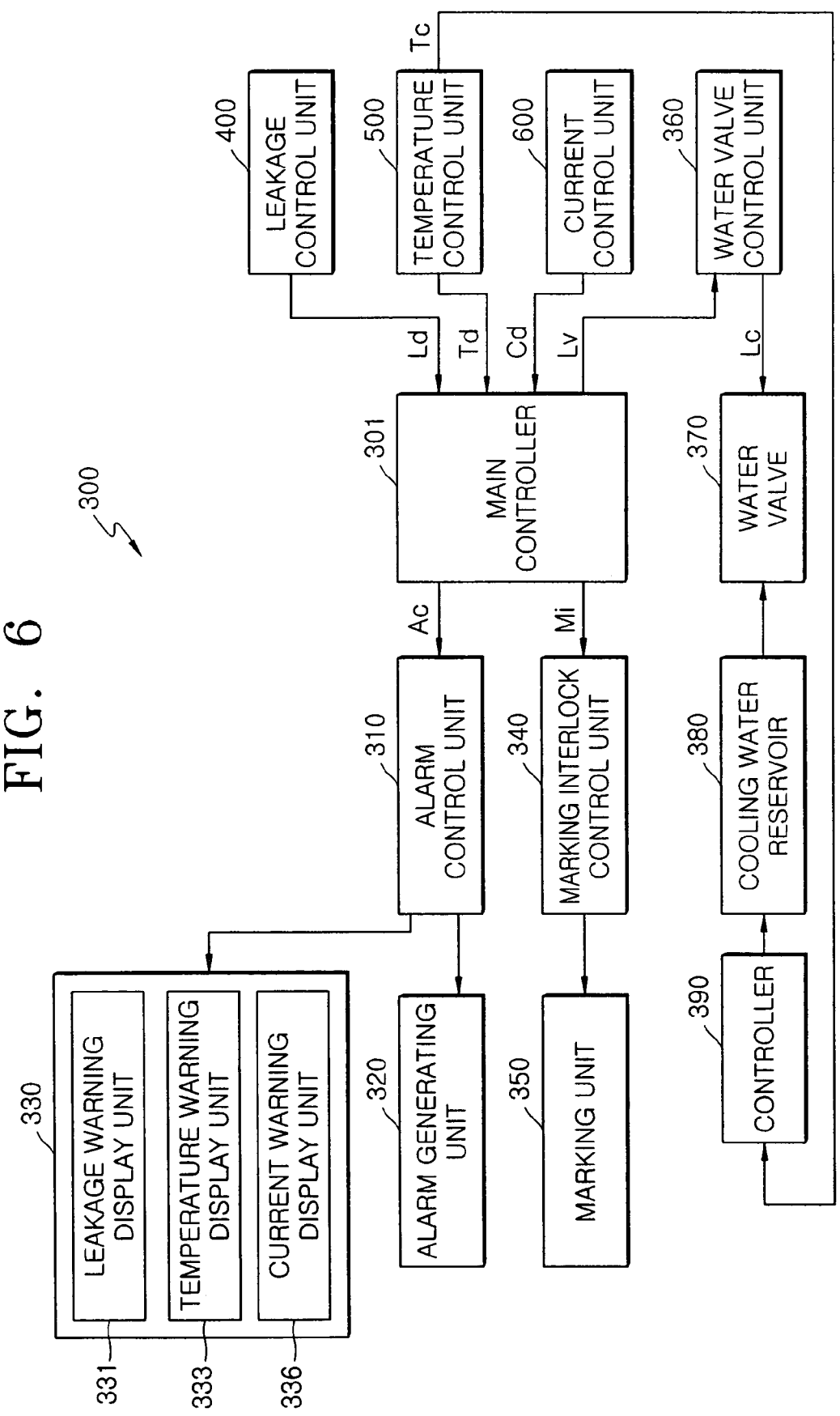
FIG. 6 is a schematic block diagram of the marking interlock system of FIG. 5, according to an embodiment of the present invention.

FIG. 6 is a schematic block diagram of the marking interlock system 300 according to an embodiment of the present invention. Referring to FIG. 6, the marking interlock system 300 includes the main controller 301, a leakage control unit 400, a temperature control unit 500, a current control unit 600, a water valve control unit 360, and the water valve 370. The marking interlock system 300 also includes an alarm control unit 310, the marking interlock control unit 340, a warning display unit 330, and an alarm generating unit 320. The main controller 301 receives output signals Ld, Td, and Cd from the leakage control unit 400, the temperature control unit 500, and the current control unit 600, respectively, and generates output signals Lv, Ac, and Mi to control the water valve control unit 360, the alarm control unit 310, and marking interlock control unit 340, respectively.

Figure 7:
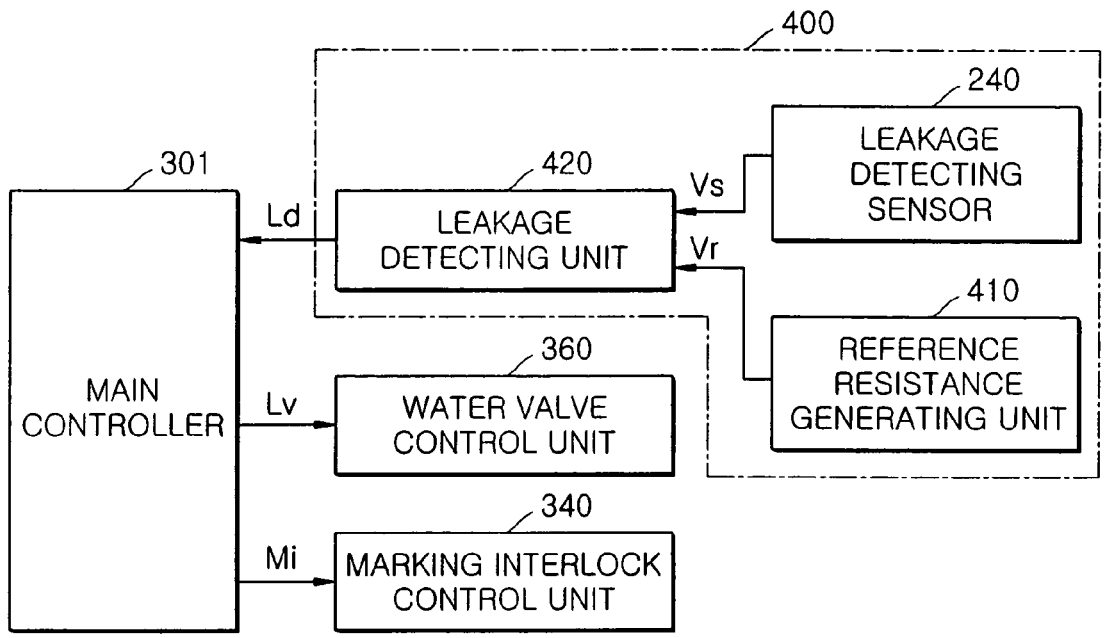
FIG. 7 is a detailed schematic diagram of a leakage control unit of the marking interlock system of FIG. 6, according to an embodiment of the present invention.

FIG. 7 is a detailed schematic diagram of a leakage control unit of the marking interlock system of FIG. 6, according to an embodiment of the present invention. Referring to FIG. 7, the leakage control unit 400 includes a leakage detecting sensor 240, a reference resistance generating unit 410, and a leakage detecting unit 420. The leakage detecting sensor 240 detects the leakage of the cooling water circulated from the cooling water reservoir 380 through the pipe 395 to the flowcell 220. When leakage of the cooling water through the pipe 395 does not occur, the resistance of the leakage detecting sensor 240 becomes finite and a signal Vs output from the leakage detecting sensor 240 remains constant. When the leakage of the cooling water through the pipe 395 occurs, the resistance of the leakage detecting sensor 240 is increased to a high, or infinite, level and the signal Vs output from the leakage detecting sensor 240 increases. The reference resistance generating unit 410 generates a reference resistance and supplies a signal Vr corresponding to the reference resistance. The signal Vr generated by the reference resistance generating unit 410 is set to be greater than the signal Vs output when the leakage of the cooling water through the pipe 395 is not detected by the leakage detecting sensor 240.

The leakage detecting unit 420 receives and compares the output Vs of the leakage detecting sensor 240 and the output Vr of the reference resistance generating unit 410. When the leakage of the cooling water through the pipe 395 is detected, the output signal Ld indicating the detection of the leakage is transmitted from the leakage detecting unit 420 to the main controller 301. In response to the output signal Ld, the main controller 301 outputs the output signal Lv indicating the detection of the leakage to the water valve control unit 360. In response to the output signal Lv, the water valve control unit 360 outputs a control signal Lc to the water valve 370 (see FIG. 6). The water valve 370 automatically closes in response to the control signal Lc. In addition, the main controller 301 outputs a control signal Mi to the marking interlock control unit 340 to stop the marking operation because of the leakage. The marking unit 350 turns off the laser diodes 211 of the laser source 210 according to the control signal Mi output from the marking interlock control unit 340. Therefore, the marking operation of the wafer is stopped.

Meanwhile, when leakage of the cooling water through the pipe 395 is not detected by the leakage detecting sensor 240, the leakage detecting unit 420 transmits the output signal Ld at a level indicating that there is no detection of leakage of the cooling water to the main controller 301. According to the output signal Ld of the leakage detecting unit 420, the main controller 301 outputs the output signal Lv to the water valve control unit 360 to maintain the water valve 370 in an open state. According to the output signal Lc of the water valve control unit 360, the open/close state of the water valve 370 is unchanged.

The leakage detecting unit 420 includes a comparison unit that employs an operational amplifier, and compares the output signal Vs of the leakage detecting sensor 240 and the output signal Vr of the reference resistance generating unit 410 to detect the leakage of the cooling water. Although the leakage detecting sensor 240 is described above as outputting the output signal Vs having an infinite resistance when the leakage of the cooling water is detected in the current embodiment of the present invention, the output signal Vs is not necessarily limited. For example, if the output Vs of the leakage detecting sensor 240 has a finite resistance instead of an infinite resistance, the output signal Vr generated by the reference resistance generating unit 410 can be accordingly set.

Figure 8:
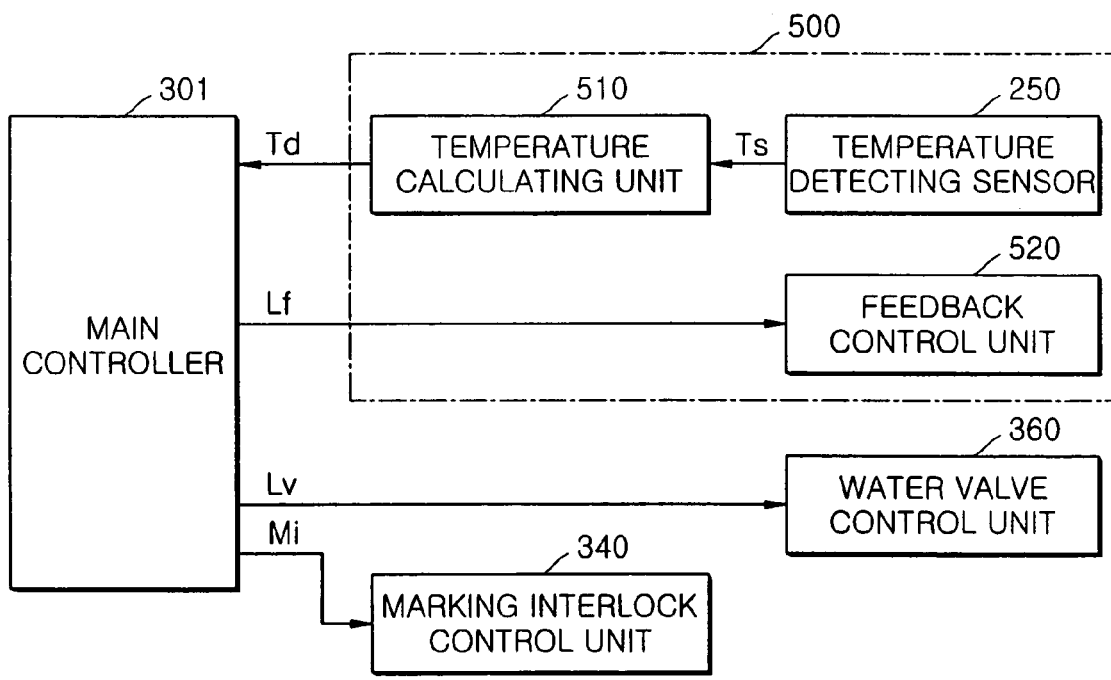
FIG. 8 is a detailed schematic diagram of a temperature control unit of the marking interlock system of FIG. 6, according to an embodiment of the present invention.

FIG. 8 is a detailed schematic diagram of a temperature control unit 500 of the marking interlock system of FIG. 6, according to an embodiment of the present invention. Referring to FIG. 8, the temperature control unit 500 includes a temperature detecting sensor 250, a temperature calculating unit 510, and a feedback control unit 520. The temperature detecting sensor 250 detects the temperature of the laser radiation region 221 of the flowcell 220 and generates an output signal Ts. The temperature calculating unit 510 receives the output signal Ts generated by the temperature detecting sensor 250 and reads the current temperature of the laser radiation region 221 of the flowcell 220 as a digital signal. The temperature calculating unit 510 transmits data Td corresponding to the current temperature of the laser radiation region 221 of the flowcell 220 to the main controller 301.

When the data Td corresponding to the current temperature of the laser radiation region 221 of the flowcell 220 is within a predetermined temperature range, the main controller 301 outputs the output signal Lv indicating that the current temperature of the laser radiation region 221 of the flowcell 220 is within the predetermined temperature range to the water valve control unit 360.

If the current temperature of the laser radiation region 221 of the flowcell 220 is equal to a predetermined reference temperature that is within the predetermined temperature range, the water valve control unit 360 outputs an output signal Lc to the water valve 370 to maintain the open/close state of the water valve 370 unchanged. If the current temperature of the laser radiation region 221 of the flowcell 220 is lower than the predetermined reference temperature, the water valve control unit 360 outputs the output signal Lc to the water valve 370 to cause the water valve 370 to open more than its current state according to the output signal Lv output from the main controller 301. Accordingly, the water valve 370 opens further and thus the flow of the cooling water flowing from the cooling water reservoir 380 to the flowcell 220 increases.

If the current temperature of the laser radiation region 221 of the flowcell 220 is higher than the predetermined reference temperature, the water valve control unit 360 outputs the output signal Lc to the water valve 370 to cause the water value 370 to close further according to the output signal Lv output from the main controller 301. Accordingly, the water valve 370 is more closed, and thus the flow of the cooling water flowing from the cooling water reservoir 380 to the flowcell 220 decreases. Accordingly, when the current temperature of the laser radiation region 221 of the flowcell 220 is within the predetermined temperature range, the open/close state of the water valve 370 is controlled according to the detected current temperature of the laser radiation region 221 of the flowcell 220 to control the flow of the cooling water circulating in the flowcell 220, resulting in the temperature of the laser radiation region 221 of the flowcell 220 to be maintained at a constant level.

In addition, when the current temperature of the laser radiation region 221 of the flowcell 220 detected by the temperature control unit 500 is within the predetermined temperature range, the main controller 301 outputs data Lf corresponding to the current temperature of the laser radiation region 221 of the flowcell 220 to the feedback control unit 520, and the feedback control unit 520 outputs a temperature control signal Tc to the controller 390 according to the data U transmitted from the main controller 301. The controller 390 controls the temperature sensor 381 of the cooling water reservoir 380 according to the temperature control signal Tc to control the temperature of the cooling water stored in the cooling water reservoir 380.

When the current temperature of the laser radiation region 221 of the flowcell 220 detected by the temperature control unit 500 is outside of the predetermined temperature range, the main controller 301 outputs the output signal Lv indicating that the current temperature of the cooling water is outside of predetermined temperature to the water valve control unit 360, and the water valve control unit 360 outputs the control signal Lc to the water valve 370 in response to the output signal Lv to cause the water valve 370 to close. Accordingly, the water valve 370 is automatically closed in response to the control signal Lc of the water valve control unit 360.

In addition, when the current temperature of the laser radiation region 221 of the flowcell 220 detected by the temperature control unit 500 is out of the predetermined temperature range, the main controller 301 outputs a control signal Mi to the marking interlock control unit 340 to stop the marking operation because of the abnormal temperature. The marking interlock control unit 350 performs the marking interlock operation according to the control signal Mi output from the main controller 301. That is, the marking interlock control unit 340 controls the marking unit 350 according to the control signal Mi to turn off the laser diodes 211 of the laser source 210, thus stopping the marking operation on the wafer.

Figure 9:
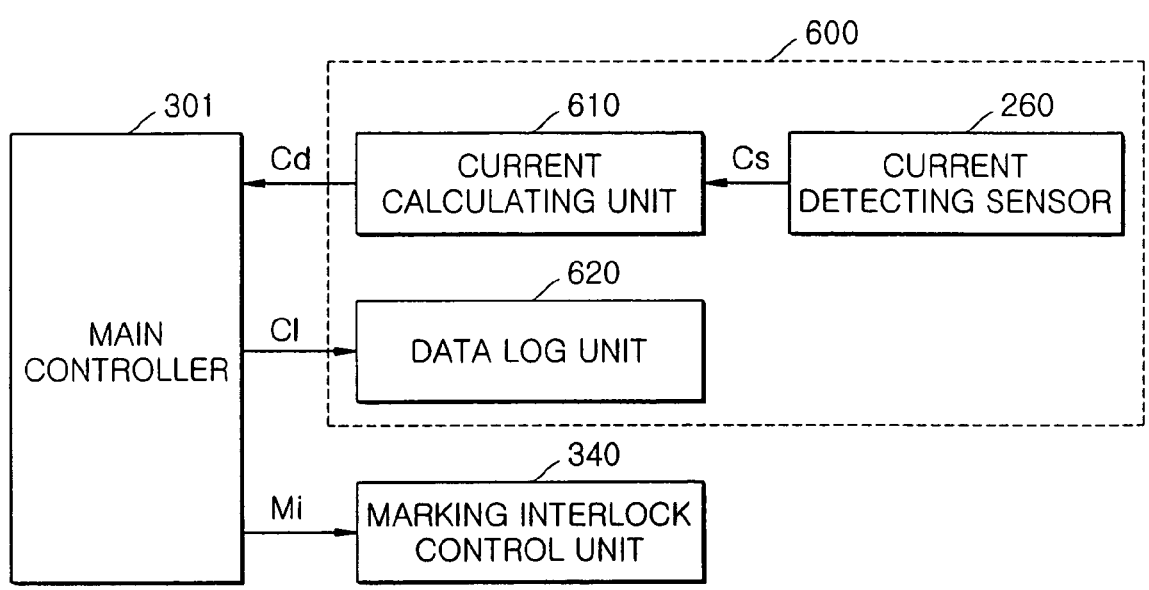
FIG. 9 is a detailed schematic diagram of a current control unit of the marking interlock system of FIG. 6, according to an embodiment of the present invention.

FIG. 9 is a detailed schematic diagram of a current control unit 600 of the marking interlock system of FIG. 6, according to an embodiment of the present invention. Referring to FIG. 9, the current control unit 600 includes a current detecting sensor 260, a current calculating unit 610, and a data log unit 620. The current detecting sensor 260 is connected to the input nodes 212 of the laser diodes 211 of the laser source 210 and detects an input signal, i.e., a current signal, input to the input nodes 212 of the laser diodes 211. The current calculating unit 610 receives an output signal Cs of the current detecting sensor 260 to read an input current transmitted to the input nodes 212 of the laser diodes 211 and outputs current data Cd as a digital signal. The main controller 301 digitizes and transmits the current data Cd transmitted from the current calculating unit 610 to the data log unit 620. The data log unit 620 logs and stores the current value transmitted from the main controller 301. This operation is performed to confirm the energy supplied to the laser diodes 210.

When the current signal supplied to the laser diodes 211 is determined to be abnormal based on the current data Cd output from the current calculating unit 610, the main controller 301 outputs the control signal Mi to the marking interlock control unit 340 to stop the marking operation because of the abnormal current. The marking interlock control unit 340 performs a marking interlock operation according to the control signal Mi transmitted from the main controller 301. Accordingly, the marking unit 350 automatically turns off the laser diodes 211 of the laser source 210 and thus the marking operation of the wafer is stopped.

Referring back to FIG. 6, the alarm control unit 310 receives an output signal Ac from the main controller 301, and controls the alarm generating unit 320 and the warning display unit 330. When leakage of the cooling water is detected by the leakage control unit 400, when an abnormal temperature of the flowcell 220 is detected by the temperature control unit 500, or when abnormal current supplied to the laser diodes 211 is detected by the current control unit 600, the main controller 301 outputs the output signal Ac indicating the abnormal state to the alarm control unit 310. The alarm control unit 310 controls the alarm generating unit 320 to generate an alarm. The alarm generating unit 320 includes, for example, a buzzer. The alarm control unit 310 controls the warning display unit 330 to display a warning signal. The warning display unit 330 includes a leakage warning display unit 331, a temperature warning display unit 333, and a current warning display unit 336. A message indicating the occurrence of the leakage of the cooling water is displayed by the leakage warning display unit 331, a message indicating the occurrence of the abnormal temperature of the flowcell 220 is displayed by the temperature warning display unit 333, and a massage indicating the occurrence of the abnormal current supplied to the laser diodes 211 is displayed by the current warning display unit 336. Although the warning display unit 330 displays only warning signals according to the output signals transmitted from the alarm control unit 330 in the current embodiment, the degree of the leakage, temperature, and current digitized by the main controller 301 may be displayed on the main display.

Figure 10:
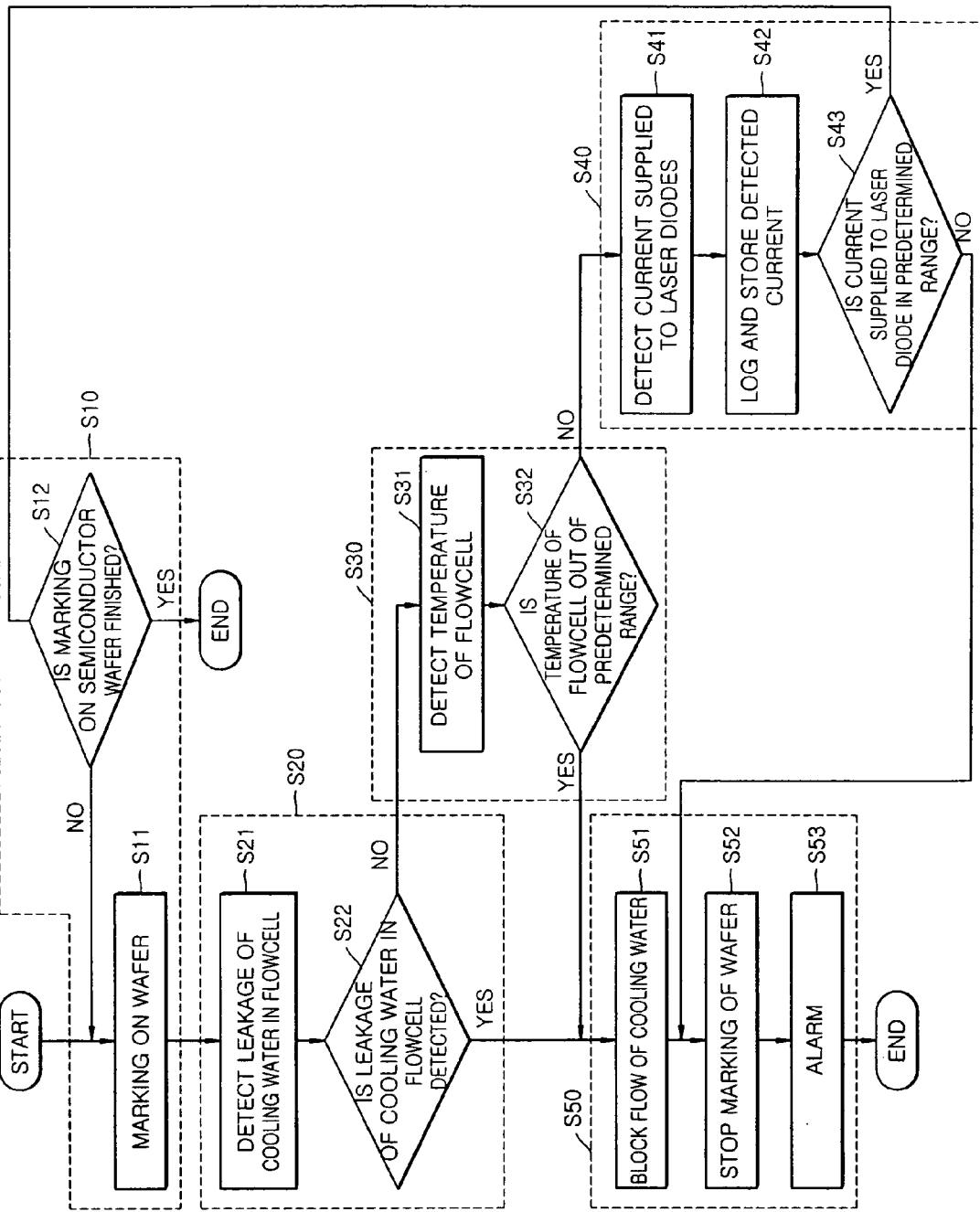
FIG. 10 is a flowchart illustrating a semiconductor wafer marking method according to an embodiment of the present invention.

FIG. 10 is a flowchart illustrating a semiconductor wafer marking method according to an embodiment of the present invention. FIG. 11 is a flowchart illustrating a process of detecting temperature in the semiconductor wafer marking method according to an embodiment of the present invention.

Referring to FIG. 10, the semiconductor wafer marking method includes marking a wafer in operation S10, detecting leakage of the flowcell 220 in operation S20, detecting the temperature of the flowcell 220 in operation S30, detecting current supplied to the laser diodes 211 in operation S40, and halting of the marking operation through marking interlock in operation S50. In operation S10, the marking operation is performed on the wafer 180 in sub-operation S11. Referring back to FIG. 4, the laser beam 101 is generated by the laser diodes 211 of the laser source 210 and becomes the laser beam 102 with a circular cross-sectional after passing through the flowcell 220 and the optical system 105. The laser beam 102 is irradiated onto the wafer 180 to begin the marking operation. When the marking begins, the detecting operations S20, S30, and S40 are sequentially performed. When the detecting operations are finished, it is determined whether the marking of an identification mark on the wafer 180 is completed in operation S12. When the marking is finished, the marking operation is terminated. When the marking is not finished, the operation S11 is performed again to perform the marking.

Next, the operation S20 of detecting the leakage of the cooling water from the flowcell 220 is performed. The leakage detecting sensor 240 detects the leakage of the cooling water from the pipe 395 into the flowcell 220 in operation S21. After the detection of the leakage of the cooling water, the leakage of the cooling water is determined in operation S22. That is, the leakage detecting unit 420 receives the output signal Vs transmitted from the leakage detecting sensor 240 and the output signal Vr transmitted from the reference resistance generating unit 410, and then determines whether the leakage occurs. The main controller 301 receives the output signal Ld from the leakage detecting unit 420. When the leakage is detected, the main controller 301 closes the water valve 370 through the water valve control unit 360. In addition, the main controller 301 controls the marking unit 350 through the marking interlock control unit 340 to stop the marking on the wafer in operation S50.

When the leakage of the cooling water is not detected in operation 22, operation S30 is performed to detect the temperature of the flowcell 220. First, the temperature detecting sensor 250 detects the temperature of the laser radiation region 221 of the flowcell 220 in operation S31. Whether the detected temperature of the laser radiation region 221 of the flowcell 220 is outside of the predetermined temperature range is determined in operation S32. That is, referring to FIG. 11, the temperature calculating unit 410 receives the output signal Ts from the temperature detecting sensor 250 and reads the current temperature. The main controller 301 receives the output signal Td from the temperature calculating unit 410 and determines whether the temperature of the laser radiation region 221 of the flowcell 220 is within the predetermined temperature range in operation S32.

When the temperature of the laser radiation region 221 of the flowcell 220 is within the predetermined temperature range, the main controller 301 determines whether the detected temperature of the laser radiation region 221 of the flowcell 220 is equal to the predetermined reference temperature in operation S33. If the detected temperature is equal to the predetermined reference temperature, the operation S40 of detecting the current of the flowcell 220 is performed. Otherwise, when the temperature of the laser radiation region 221 of the flowcell 220 is not equal to the predetermined temperature, the main controller 301 determines whether the detected temperature is lower than the predetermined reference temperature in operation S34. If the detected temperature is lower than the predetermined reference temperature, the water valve control unit 360 controls the water valve 370 to increase the flow of the cooling water flowing through the pipe 395 in operation S35. If the detected temperature is higher than the predetermined reference temperature, the water valve control unit 360 controls the water valve 370 to decrease the flow of the cooling water flowing through the pipe 395 in operation S36.

When the detected temperature of the laser radiation region 221 is outside of the predetermined temperature range, the main controller 301 controls the water valve control unit 360 to close the water valve 370 to prevent the abnormal flowing of the cooling water in operation S51. In addition, the main controller 301 controls the marking unit 350 through the marking interlock control unit 340 to stop the marking of the wafer in operation S52.

After operation S35 or S36, in which the flow of the cooling water is controlled by the control of the water valve 370 is performed, the input current supplied to the flowcell 220 is detected in operation S40. The current detecting sensor 260 detects the input current supplied to the laser diodes 211 of the laser source 210, and then the current calculating unit 610 digitizes the detected input current and transmits the digital signal to the main controller 301. The main controller 301 logs the input current and the input current is stored in the data log unit 620. When the input current of the laser diodes 210 is within a predetermined range, the wafer marking operation S10 is performed. However, when a sudden large input current is supplied to the laser diodes 210, i.e., when a hunting phenomenon occurs, the main controller 301 controls the marking unit 350 through the marking control unit 340 to turn off the laser diodes 210, and thus the marking operation of the wafer is stopped in operation S52.

In the marking operations according to the above-described embodiment of the present invention, the detecting of the leakage of the cooling water, the detecting of the temperature of the flowcell, and the detecting of the input current of the laser diodes of the flowcell are sequentially performed as an example. However, the order of the detecting operations are not limited to this order and can be performed in an arbitrary order. Also, the detecting operations can be performed simultaneously.

As described above, the semiconductor marking apparatus according to the present invention includes the marking interlock system such that the marking operation of a wafer is halted when the leakage of the cooling water occurs, when the temperature of the laser radiation region of the flowcell is abnormal, or when the input current supplied to the laser diodes is abnormal, thus preventing product defects in advance and reducing time waste. The present invention can inform a user of the abnormal state with an alarm or a warning indication, such that the user can promptly manage the abnormal state.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor wafer marking apparatus for marking an identification mark on a semiconductor wafer to identify the semiconductor wafer, the apparatus comprising:
    a laser head unit comprising:
        a flowcell having a laser radiation region on an upper surface thereof; and
        a laser source radiating laser energy on the laser radiation region in response to an input current;
    an optical system focusing the laser energy radiated from the laser source in response to an input current to form a laser beam and radiating the laser beam on the semiconductor wafer;
    a cooling water reservoir storing cooling water;
    a pipe that is disposed in the flowcell and connected to an inlet and an outlet of the cooling water reservoir and through which the cooling water flows to maintain the laser radiation region of the flowcell at a constant temperature;
    a marking interlock system that detects leakage of cooling water from the pipe, an abnormal temperature of the laser radiation region, and an abnormal input current supplied to the laser source, and generates a marking interlock signal to terminate a marking operation of the semiconductor wafer when the marking interlock system detects at least one of the leakage of cooling water from the pipe, the abnormal temperature of the laser radiation region, and the abnormal input current supplied to the laser source; and
    a marking unit that turns off the laser source to terminate the marking of the semiconductor wafer in response to the marking interlock signal generated by the marking interlock system.

2. The apparatus of claim 1, wherein the laser source comprises a plurality of laser diodes disposed above the laser radiation region of the flowcell.

3. The apparatus of claim 1, wherein the marking interlock system comprises:
    a leakage detecting sensor which detects the leakage of the cooling water from the pipe;
    a temperature detecting sensor which detects the temperature of the laser radiation region of the flowcell;
    a current detecting sensor which detects the input current supplied to the laser source; and
    a controller which receives output signals from the leakage detecting sensor, the temperature detecting sensor, and the current detecting sensor, and outputs the marking interlock signal.

4. The apparatus of claim 3, wherein the leakage detecting sensor is disposed on the lower surface of a portion of the flowcell.

5. The apparatus of claim 3, wherein the temperature detecting sensor is disposed on the upper surface of the flowcell adjacent to the laser radiation region.

6. The apparatus of claim 3, wherein the current detecting sensor is connected to an input node of the laser source.

7. The apparatus of claim 1 further comprising a water valve which is connected to the pipe and controlled by the marking interlock system, and controls the flow of the cooling water through the pipe.

8. The apparatus of claim 7, wherein the water valve is disposed adjacent to the outlet of the cooling water reservoir where the cooling water flows toward the flowcell.

9. A marking interlock system of a semiconductor wafer marking apparatus which includes a laser source generating laser energy, a flowcell dispersing the laser energy emitted from the laser source, a pipe which is disposed in the flowcell and through which cooling water is circulated, and a cooling water reservoir which is connected to the pipe, the system comprising:
    a leakage control unit which detects leakage of the cooling water;
    a temperature control unit which detects a temperature of a laser radiation region of the flowcell;
    a current control unit which detects an input current supplied to the laser source;
    a controller which receives at least one of a leakage detecting signal transmitted from the leakage control unit, an abnormal temperature detecting signal transmitted from the temperature control unit, and an abnormal input current signal transmitted from the current control unit, and generates in response an alarm control signal and a marking interlock signal;

an alarm unit which indicates at least one of the leakage detected by the leakage control unit, the abnormal temperature detected by the temperature control unit, and the abnormal input current detected by the current control unit in response to the alarm control signal transmitted from the controller; and a marking interlock control unit which turns off the laser source in response to the marking interlock signal transmitted from the controller.

10. The system of claim 9, wherein the leakage control unit comprises:

a leakage detecting sensor which detects the leakage of the cooling water;

a reference resistance generating unit which generates a reference signal; and a leakage detecting unit which compares an output signal transmitted from the leakage detecting sensor and the reference signal transmitted from the reference resistance generating unit and generates a leakage detecting signal.

11. The system of claim 9, wherein the temperature control unit comprises:

a temperature detecting sensor which detects the temperature of the laser radiation region of the flowcell; and a temperature calculating unit which digitizes an output signal transmitted from the temperature detecting sensor.

12. The system of claim 11, wherein the temperature control unit further comprises a feedback unit which maintains the cooling water stored in the cooling water reservoir at a constant temperature using a feedback control signal transmitted form the controller receiving an output signal transmitted from the temperature calculating unit.

13. The system of claim 9, wherein the current control unit comprises:

a current detecting sensor which detects the input current supplied to the laser source;

a current calculating unit which digitizes the input current detected by the current detecting sensor; and a data log unit which logs an output signal of the current calculating unit through the controller.

14. The system of claim 9 further comprising:

a water valve which is connected to the pipe and controls the flow of the cooling water; and a water valve control unit which controls the water valve in response to a water valve control signal transmitted form the controller.

15. The system of claim 9, wherein the alarm unit comprises:

an alarm generating unit which generates an alarm when at least one of the leakage is detected by the leakage control unit, the abnormal temperature is detected by the temperature control unit, and the abnormal input current is detected by the current control unit;

a warning display unit which displays a warning when at least one of the leakage is detected by the leakage control unit, the abnormal temperature is detected by the temperature control unit, and the abnormal input current is detected by the current control unit; and an alarm control unit which controls the alarm generating unit and the warning display unit in response to the alarm control signal transmitted from the controller.

16. A semiconductor wafer marking method using a semiconductor wafer marking apparatus which includes a laser source generating laser energy, a flowcell dispersing the laser energy emitted from the laser source, a pipe which is disposed in the flowcell and through which cooling water is circulated, and a cooling water reservoir connected to the pipe, the method comprising:

performing a marking operation on the semiconductor wafer;

detecting leakage of the cooling water in the flowcell from the pipe;

detecting the temperature of a portion of the flowcell on which the laser energy is radiated;

detecting an input current supplied to the laser source; and interlocking the marking of the semiconductor wafer when at least one of the leakage is detected, an abnormal temperature is detected and an abnormal input current is detected.

17. The method of claim 16, wherein the detecting of the leakage comprises:

sensing the leakage of the cooling water in the flowcell from the pipe to generate a sensor signal;

determining the leakage of the cooling water by comparing the sensor signal with a reference value;

performing the interlocking of the marking when the leakage of the cooling water is detected and stopping the marking of the semiconductor wafer; and performing the detecting of the temperature when leakage of the cooling water is not detected.

18. The method of claim 16, wherein the detecting of the temperature comprises:

detecting the temperature of the flowcell;

determining whether the detected temperature of the flowcell is outside of a predetermined range of temperatures;

performing the interlocking of the marking when the detected temperature of the flowcell is outside of the predetermined temperature range and stopping the marking on the semiconductor wafer;

determining whether the detected temperature is equal to a predetermined reference temperature when the detected temperature of the flowcell is within the predetermined temperature range;

performing the detecting of the current when the detected temperature is equal to the predetermined reference temperature;

determining whether the detected temperature is lower than the predetermined reference temperature when the detected temperature is not equal to the predetermined reference temperature;

increasing the flow of the cooling water which is supplied from the cooling water reservoir and circulated in the flowcell when the detected temperature is lower than the predetermined reference temperature; and decreasing the flow of the cooling water which is supplied from the cooling water reservoir and circulated in the flowcell when the detected temperature is higher than the predetermined reference temperature.

19. The method of claim 16 further comprising, after the detecting of the input current:

logging and storing the detected input current;

determining whether the detected input current is within a predetermined current range;

performing the marking when the detected input current is within the predetermined current range; and performing the interlocking of the marking when the detected input current is outside of the predetermined current range and stopping the marking of the semiconductor wafer.

20. The method of claim 16, wherein the detecting of the leakage, the detecting of the temperature, and the detecting of the current one of sequentially and simultaneously performed.

21. The method of claim 16, wherein the interlocking of the marking comprises:
    blocking the cooling water from circulating through the pipe when at least one of the leakage is detected in the detecting of the leakage, the detected temperature is determined to be outside of the predetermined temperature range in the detecting of the temperature, and the detected current is determined to be outside of the predetermined current range in the detecting of the current;
    stopping the marking of the semiconductor wafer; and
    indicating the stopping of the marking on the semiconductor wafer.

22. The method of claim 16, wherein performing the marking operation comprises:
    marking the semiconductor wafer using the laser energy generated by the laser source;
    determining whether the marking of the semiconductor wafer is completed after the detecting of the leakage, temperature, and input current;
    continuing the marking operation of the semiconductor wafer when the marking is not finished; and
    terminating the marking operation when the marking is finished.

* * * * *

UNITED STATES PATENT AND TRADEMARK OFFICE
CERTIFICATE OF CORRECTION

PATENT NO.       : 7,652,224 B2
APPLICATION NO.  : 11/448305
DATED            : January 26, 2010
INVENTOR(S)      : Ki-youl Lim It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 726 days.

Signed and Sealed this

Twenty-third Day of November, 2010

David J. Kappos
*Director of the United States Patent and Trademark Office*